United States Patent
Kim

[11] Patent Number: 5,915,267
[45] Date of Patent: Jun. 22, 1999

[54] METHOD FOR MEASURING PIEZOELECTRIC CONSTANT OF THIN FILM SHAPED PIEZOELECTRIC MATERIAL

[75] Inventor: Dong-Guk Kim, Daejeon, Rep. of Korea

[73] Assignee: Daewoo Electronics Co., Ltd., Seoul, Rep. of Korea

[21] Appl. No.: 08/987,615

[22] Filed: Dec. 9, 1997

[51] Int. Cl.$^6$ .................................................. G01L 25/00
[52] U.S. Cl. ............................................................. 73/1.15
[58] Field of Search .................... 73/1.15, 618, 634, 73/643, 721, 727; 29/25.35

[56] References Cited

U.S. PATENT DOCUMENTS

| | | |
|---|---|---|
| 3,954,015 | 5/1976 | Zalesak et al. . |
| 4,668,909 | 5/1987 | Hickernell et al. . |
| 5,222,396 | 6/1993 | Takata et al. .............................. 73/618 |
| 5,301,558 | 4/1994 | Livingston et al. . |
| 5,355,715 | 10/1994 | Rausch et al. ............................ 73/1.15 |
| 5,431,055 | 7/1995 | Takata et al. .............................. 73/618 |
| 5,447,051 | 9/1995 | Hanks et al. .............................. 73/1.15 |
| 5,815,900 | 10/1998 | Ichikawa et al. ...................... 29/25.35 |

*Primary Examiner*—William Oen
*Attorney, Agent, or Firm*—Pillsbury Madison & Sutro LLP

[57] ABSTRACT

Method for measuring piezoelectric constant of thin film shaped piezoelectric material is disclosed. After forming a thin film shaped piezoelectric material having a bottom electrode and a top electrode, a microscope is placed above the top electrode and a height of a displacement of the thin film is measured. A pneumatic pressure is generated from pressing member and is applied to the thin film. A charge generated from the thin film is measured by a charge measuring member. The piezoelectric constant of the thin film shaped piezoelectric material is calculated by using the measured charge and the magnitude of the applied pneumatic pressure. The piezoelectric constant can be measured by using a pneumatic loading method and by applying a uniform pneumatic pressure to the whole surface of the piezoelectric material regardless of a topology of the piezoelectric material, without causing a short or a plastic deformation.

19 Claims, 9 Drawing Sheets

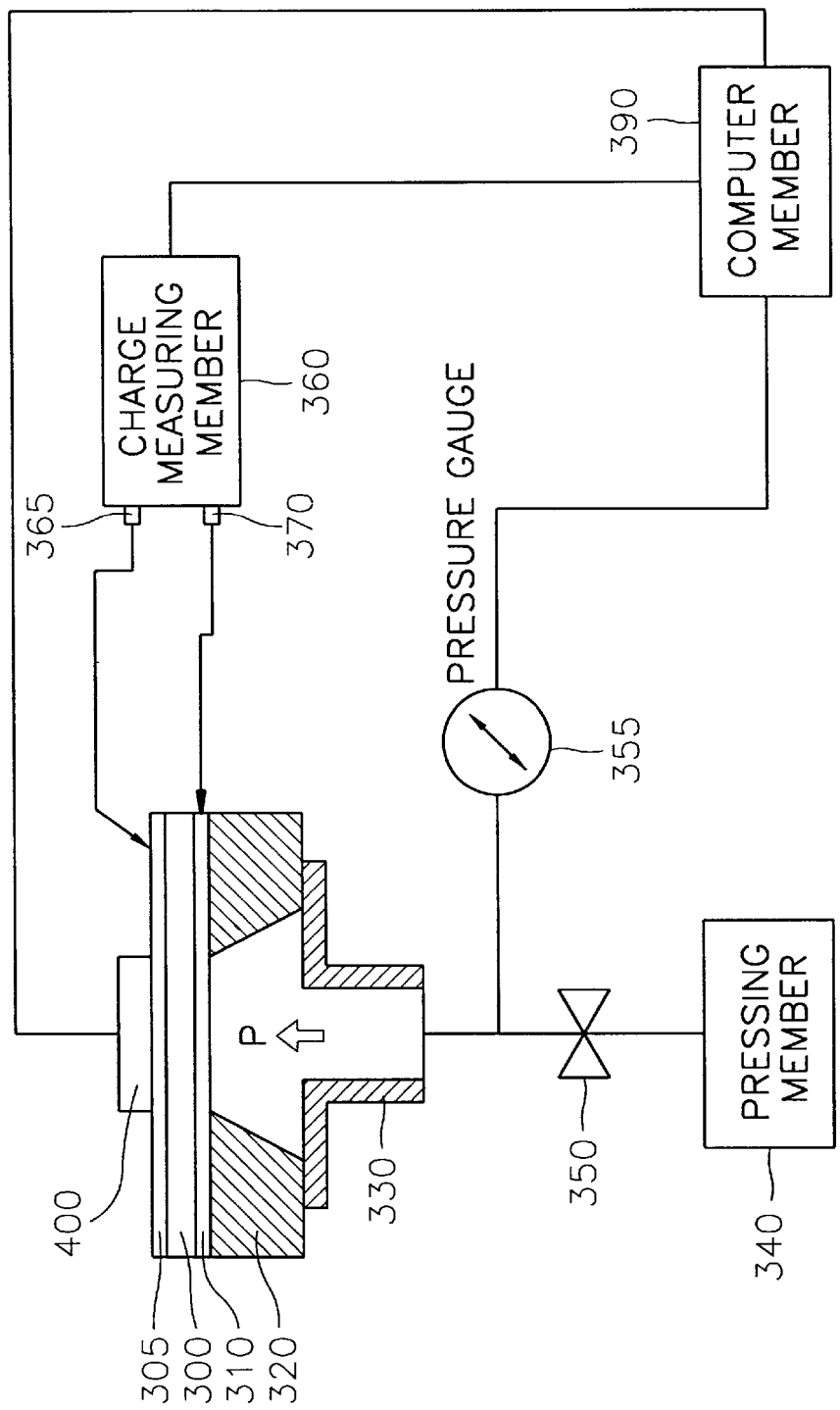

METHOD FOR MEASURING PIEZOELECTRIC CONSTANT OF THIN FILM SHAPED PIEZOELECTRIC MATERIAL

BACKGROUND OF THE INVENTION

1. Field of the Invention

The present invention relates to a method for measuring a piezoelectric constant of thin film shaped piezoelectric material, and more particularly to a method for measuring a piezoelectric constant of a thin film shaped piezoelectric material which can exactly measure a piezoelectric constant of a thin film shaped piezoelectric material by applying a uniform pneumatic pressure to the whole surface of the thin film shaped piezoelectric material regardless of a topology of the thin film, without causing a short in the thin film or a plastic deformation of the thin film.

2. Prior Art

Electronic devices such as micro-processors and memories have been miniaturized, so their performances have improved and their prices have strongly decreased. There is a similar need to miniaturize mechanical devices such as actuators, and an additional need for micro-actuators for future applications, for example, medical and biomedical. In general, micro-mechanical devices can be based on the electrostatic, piezoelectric, thermal, or electromagnetic principle.

A piezoelectric actuator converts mechanical energy into electrical energy via the piezoelectric effect, or converts electrical energy into mechanical energy via the inverse piezoelectric effect. Namely, the piezoelectric actuator converts electrical energy into mechanical energy by contraction or expansion of a piezoelectric material therein according to the orientation of applied voltage and internal polarization of the piezoelectric material. The construction or expansion of the piezoelectric material is not determined by the dimensions of the piezoelectric material, but by the magnitude and orientation of the applied voltage. Therefore, a piezoelectric thin film can be used to fabricate the micro-actuator. The maximum elongation of piezoelectric thin film is restricted by a breakdown field or a maximum stress. Hence, the micro actuator having the piezoelectric thin film is generally operated at a low voltage range below 10 V.

The piezoelectric actuator can be fabricated at a low cost by using the silicon technology. Various applications of piezoelectric thin film integrated on a silicon substrate are known. In most cases, ZnO is used as the piezoelectric thin film. However, lead zirconate titanate (PZT:$Pb(Zr,Ti)O_3$) has a better piezoelectric property than ZnO. PZT is a complete solid solution of lead zirconate ($PbZrO_3$) and lead titanate ($PbTiO_3$). PZT having a cubic structure exists in a paraelectric phase at a high temperature. Orthorhombic structure PZT exists in an antiferroelectric phase, rhombohedral structure PZT exists in a ferroelectric phase, and tetragonal structure PZT exists in a ferromagnetic phase according to the composition ratio of Zr and Ti at a room temperature. FIG. 1 shows a binary phase diagram of PZT. Referring to FIG. 1, a morphotropic phase boundary (MPB) of the tetragonal phase and the rhombohedral phase exists as a composition which includes Zr:Ti at a ratio of 1:1. PZT has a maximum dielectric property and a maximum piezoelectric property at the MPB. The MPB exists in a wide region in which the tetragonal phase and the rhombohedral phase coexist, but does not exist at a certain composition. Researchers do not agree about the composition of the phase coexistent region of PZT. Various theories such as thermodynamic stability, compositional fluctuation, and internal stress have been suggested as the reason for the phase coexistent region.

Nowadays, PZT thin film is manufactured by various processes such as spin coating, organometallic chemical vapor deposition (OMCVD), and sputtering. It is reported that a method for measuring a piezoelectric constant of PZT thin film by measuring the amount of charge generated from the PZT thin film because of applying force to the PZT thin film (see: Measurement of Piezoelectric Coefficient of Ferroelectric Thin Films by K. Lefki and G. J. M. Dormans, J. Appl. Phys. 76 (3), Aug. 1, 1994, pp 1764–1767).

The electrical property of piezoelectric thin film is determined by an elastic constant, a piezoelectric constant, and a dielectric constant. Generally, the piezoelectric constant means an electrical activity level of piezoelectric material. For example, the piezoelectric constant means an expansion or contraction magnitude of a piezoelectric material corresponding to an applied electric field. An apparatus for testing properties of multilayer piezoelectric actuator such as piezoelectric constant, Young's modulus, and capacitance, is disclosed in U.S. Pat. No. 5,301,558 (issued to Jeffrey A. Livingstone et al.). FIG. 2 is a cross-sectional view for showing the apparatus for testing piezoelectric properties of the multilayer piezoelectric actuator, and FIG. 3 shows a block diagram of the control circuitry associated with the testing apparatus.

Referring to FIG. 2, the testing apparatus 10 has a piezoelectric actuator 15 having a housing 18 and a plurality of piezoelectric elements 20 formed in a column having a length, $L_1$. Housing 18 includes a diaphragm 16 attached to an end of housing 18. Housing 18 protects actuator 15 and is used to mount actuator 15 to testing apparatus 10. The plurality of piezoelectric elements 20 are aligned with an axis 25. Each of piezoelectric elements 20 is shaped as a disk having a cross-sectional area, A. Metallic electrodes 30 are interleaved among the plurality of piezoelectric elements 20. Piezoelectric elements 20 are expanded axially, proportional to the magnitude of applied electrical energy. Thus, actuator 15 having piezoelectric elements 20 converts electrical energy into mechanical energy.

Referring to FIG. 2, testing apparatus 10 has a front plate 40, a rear plate 45, and an intermediate plate 50, which are made of hardened steel. Front plate 40 receives actuator 15 and rear plate 45 defines a cavity 55. A pneumatic cylinder 60 having a piston 65 therein is disposed within cavity 55 and is rigidly attached to intermediate plate 50. Front plate 40, intermediate plate 50, and pneumatic cylinder 60 define a central bore axially aligned with housing 18. A cylindrical plate 70 is disposed within the central bore of front plate 40, to lie adjacent to diaphragm 16 of housing 18. For example, cylindrical plate 70 is made of a high tensile steel and one end of cylindrical plate 70 defines a polished surface.

A steel pillow 75 is disposed within the central bore of intermediate plate 50 and pneumatic cylinder 60. One end of pillow 75 is adjacent to piston 65 of pneumatic cylinder 60. A load cell 80 is disposed between the other end of pillow 75 and cylindrical plate 70. Load cell 80 is formed in a shape of a cylindrical ring, and is coaxially disposed about axis 25. Pillow 75 and piston 65 define a small bore axially aligned with axes 25. A fiber optic sensor 85 is disposed within the small bore. Fiber optic sensor 85 has a sensor head located intermediate the polished surface of cylindrical plate 70. As shown in FIG. 2, a sensor housing 90 is fixedly attached to rear plate 45. Sensor housing 90 includes a micrometer 95 adapted to adjust the sensor head invariable proximity to cylindrical plate 70.

Referring to FIG. 3, a proportional pressure regulator 100 is connected to a source of pressurized air 105. Proportional pressure regulator 100 controllably supplies pressurized air to pneumatic cylinder 60. Proportional pressure regulator 100 applies an axial force to actuator 15 in response to the received pressurized air. A load member 110 measures the applied force on actuator 15 and responsively produces a force signal, $F_n$. Load member 110 includes load cell 80 and a dual mode amplifier 115. Load cell 80 measures the applied force on actuator 15 and responsively produces a sense signal. Dual mode amplifier 115 receives and conditions the sense signal, to produce the force signal, $F_n$, having a predetermined voltage range. An optical member 120 measures a linear displacement of actuator 15 and responsively produces a position signal, $L_n$. Optical member 120 includes sensor 85 and associated signal conditioning circuitry 125. Sensor 85 emits random light onto the polished surface of cylindrical plate 70 and senses the reflected light, to responsively produce an optical signal. Signal conditioning circuitry 125 receives the optical signal and transposes the optical signal to the position signal, $L_n$, having a voltage level proportional to the magnitude of the optical signal.

A high voltage power supply 130 delivers constant voltage levels to actuator 15. A sensing member 135 includes a current probe for measuring the electrical current flowing through actuator 15 and a voltage probe for measuring the voltage applied to actuator 15. A data acquisition board 140 is connected to signal conditioning circuitry 125, sensing member 135, high voltage power supply 130, and pressure regulator 100. A computer 145 receives the various signals via data acquisition board 140 and determines various performance properties of actuator 15. Also, computer 145 controls high voltage power supply 130 and pressure regulator 100 via data acquisition board 140. A plotter 150 and a printer 155 are connected to computer 145 for displaying test results.

It will be described below that a method for measuring the piezoelectric constant of the multilayer actuator by using the testing apparatus.

At first, the various test instruments such as load member 110, optic member 120, etc., which are associated with the piezoelectric constant, are initialized before the piezoelectric constant of the piezoelectric actuator 15 is measured. That is, no force or load is applied to actuator 15, amplifier 115 is adjusted to control the magnitude of the force signal, $F_n$, to zero, and signal conditioning circuitry 125 associated with optic sensor 85 is initialized. Next, pneumatic cylinder 60 applies a predetermined force, for example 250 lbs., onto actuator 15. High voltage power supply 130 initially applies a voltage of 200V for a predetermined time of five seconds to actuator 15. Computer 145 controls high voltage power supply 130 to incrementally deliver voltages to actuator 15 at 100V increments up to 900V. The magnitude of the voltage delivered to actuator 15 is represented by a signal, $V_m$. Actuator 15 is displaced a predetermined amount with each incremental increase in voltage. Optical sensor member 120 determines the axial displacement of actuator 15 and responsively delivers the position signal, $L_m$, to computer 145, at each incremental change in voltage. Computer 145 acquires the test data and plots the data for later analysis. Once the data is acquired, the data is ready to be analyzed and evaluated. The piezoelectric constant is determined according to the relationship:

$$\text{piezoelectric constant} = \frac{|L_{m=0} - L_{m=f}|}{|L_{m=0} - L_{m=f}|} \times 1/N$$

wherein m is an integer representing the number of measurements at each increment of applied voltage, N represents the number of active or polled piezoelectric discs, 0 represents the original value and f represents the final value.

However, in the above-described apparatus, after the predetermined force and voltage are applied to the piezoelectric actuator, the piezoelectric constant is calculated by measuring the displacement of the piezoelectric actuator according to the applied voltage. So, the piezoelectric constant measured by using the above described apparatus may vary according to the position and condition of the piezoelectric element and the arranged condition of the optic sensor member. Also, an error may occur in measuring the piezoelectric constant because the amount of displacement of the piezoelectric element is very small at a low voltage range. In addition, the construction of the apparatus may be complicated and the manufacturing cost may be high. Also, when a piezoelectric constant of single layer piezoelectric thin film is measured by using the apparatus, there may be a short in the single layer piezoelectric thin film, or a plastic deformation of the single layer piezoelectric thin film may occur. Furthermore, it is difficult to apply a constant force to the whole surface of the single layer piezoelectric thin film.

SUMMARY OF THE INVENTION

Accordingly, considering the conventional problems as described above, it is an object of the present invention to provide a method for measuring a piezoelectric constant of thin film shaped piezoelectric material which can exactly measure a piezoelectric constant of a thin film shaped piezoelectric material by using a pneumatic loading method and by applying a constant pneumatic pressure to the whole surface of the thin film shaped piezoelectric material regardless of a topology of the thin film, without causing a short in the piezoelectric material or a plastic deformation of the piezoelectric material.

To accomplish the object, there is provided in a first embodiment of the present invention a method for measuring a piezoelectric constant of a piezoelectric material comprising the steps of:

forming a thin film shaped piezoelectric material on a bottom electrode after the bottom electrode is formed;

forming a top electrode on the thin film shaped piezoelectric material;

placing a microscope for measuring a height of a displacement of the thin film shaped piezoelectric material above the top electrode;

generating a pneumatic pressure from a pressing member;

applying the pneumatic pressure to the thin film shaped piezoelectric material placed between the top electrode and the bottom electrode through a conduit pipe;

changing the pneumatic pressure applied to the thin film shaped piezoelectric material;

measuring a charge generated from the thin film shaped piezoelectric material after the top electrode is connected to a first terminal of a charge measuring member and the bottom electrode is connected to a second terminal of the charge measuring member;

recording the measured charge and the magnitude of the applied pneumatic pressure in a computer member; and calculating the piezoelectric constant of the thin film shaped piezoelectric material by using the measured charge and the magnitude of the applied pneumatic pressure.

The bottom electrode is formed on a substrate after the substrate is provided. The step of forming the top electrode further comprises a step of forming an opening in the bottom of the substrate by etching a portion of the bottom of the substrate to expose a portion of the bottom electrode.

The top electrode and the bottom electrode are respectively formed by using an electrically conductive metal such as gold, platinum, tantalum, or platinum-tantalum and by using a sputtering method or a chemical vapor deposition method and the step of forming the thin film shaped piezoelectric material is performed by using lead zirconate titanate ($Pb(Zr,Ti)O_3$) produced by a sol-gel method and by a sputtering method or a chemical vapor deposition method.

The pressing member is a vacuum pump or a compressor and the charge measuring member is a charge amplifier or a picoammeter.

The step of applying the pneumatic pressure to the thin film shaped piezoelectric material is performed after initializing the computing member, a pressure gauge, the charge measuring member, and the pressing member, and the step of changing the pneumatic pressure applied to the thin film shaped piezoelectric material is performed by adjusting the pneumatic pressure by operating a release valve.

Preferably, the step of calculating the piezoelectric constant of the thin film shaped piezoelectric material further comprises the steps of recording the measured height of the displacement of the thin film shaped piezoelectric material in the computer member, recording a diameter and a thickness of the thin film shaped piezoelectric material in the computer member, calculating a stress generated in the thin film shaped piezoelectric material by using the magnitude of the applied pneumatic pressure and the diameter and the thickness of the thin film shaped piezoelectric material, and calculating the piezoelectric constant of the thin film shaped piezoelectric material by using the calculated stress and the recorded charge.

Also, to accomplish the object, there is provided in a second embodiment of the present invention a method for measuring a piezoelectric constant of a piezoelectric material comprising the steps of:

forming a bottom electrode on a substrate after the substrate is provided;

forming a thin film shaped piezoelectric material on the bottom electrode;

forming a top electrode on the thin film shaped piezoelectric material;

forming a strain gauge for measuring a stress generated in the thin film shaped piezoelectric material on the top electrode;

generating a pneumatic pressure from a pressing member;

applying the pneumatic pressure through a conduit pipe to the thin film shaped piezoelectric material placed between the top electrode and the bottom electrode;

changing the pneumatic pressure applied to the thin film shaped piezoelectric material by adjusting a release valve;

measuring a charge generated from the thin film shaped piezoelectric material after the top electrode is connected to a first terminal of a charge measuring member and the bottom electrode is connected to a second terminal of the charge measuring member;

recording the measured charge and the measured stress in a computer member;

recording the measured height of the displacement of the thin film shaped piezoelectric material in the computer member; and calculating the piezoelectric constant of the thin film shaped piezoelectric material by using the measured charge and the magnitude of the applied pneumatic pressure.

Therefore, according to the present invention, a uniform pneumatic pressure can be applied to the thin film shaped piezoelectric material without considering a topology of the piezoelectric material because the pneumatic pressure such as a uniform vacuum pressure or a uniform gas pressure, can be applied to the piezoelectric material. Also, a short in the thin film shaped piezoelectric material or a plastic deformation of the thin film shaped piezoelectric can be prevented. Also, the charge measuring member can prevent an error in the measurement of the charge generated from the piezoelectric material.

BRIEF DESCRIPTION OF THE DRAWINGS

The above object and advantages of the present invention will become more apparent by describing in detail preferred embodiments thereof with reference to the attached drawings, in which:

FIG. 7 illustrates an apparatus for measuring a piezoelectric constant of a thin film shaped piezoelectric material according to a second embodiment of the present invention;

DETAILED DESCRIPTION OF THE INVENTION

Hereinafter, the preferred embodiments of the present invention will be explained in more detail with reference to the accompanying drawings.

Embodiment 1

Figure 1:
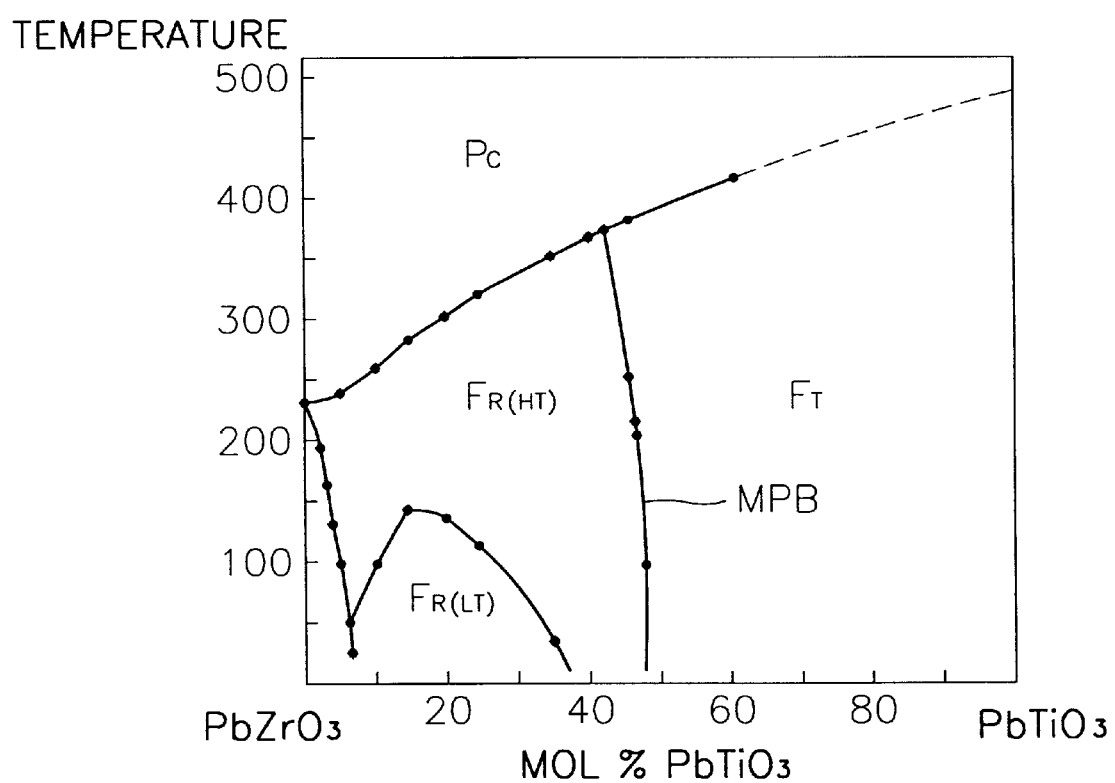
FIG. 1 is a binary phase diagram of PZT.
Figure 2:
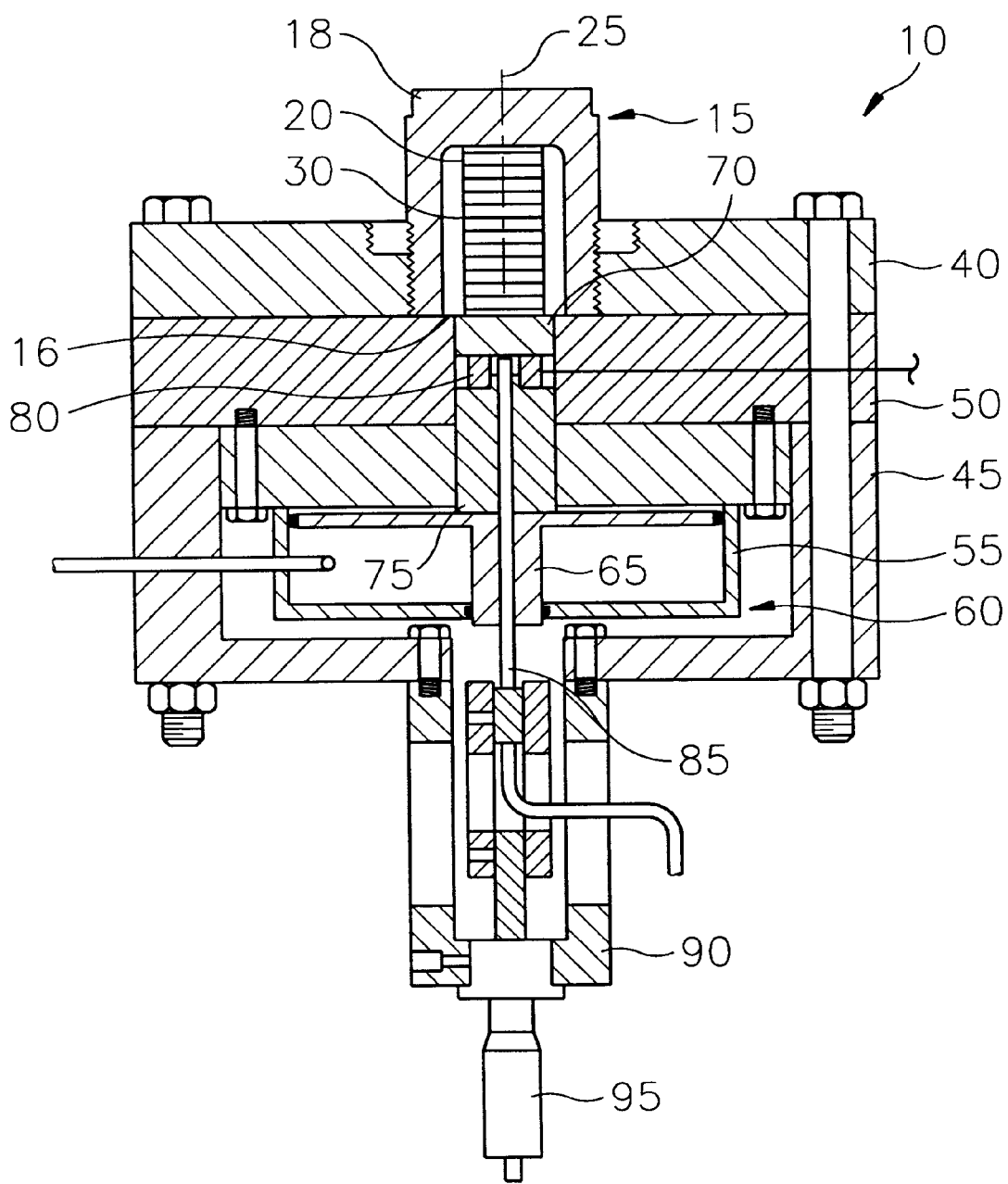
FIG. 2 is a cross-sectional view for showing the conventional apparatus for testing piezoelectric properties of multilayer piezoelectric actuator.
Figure 3:
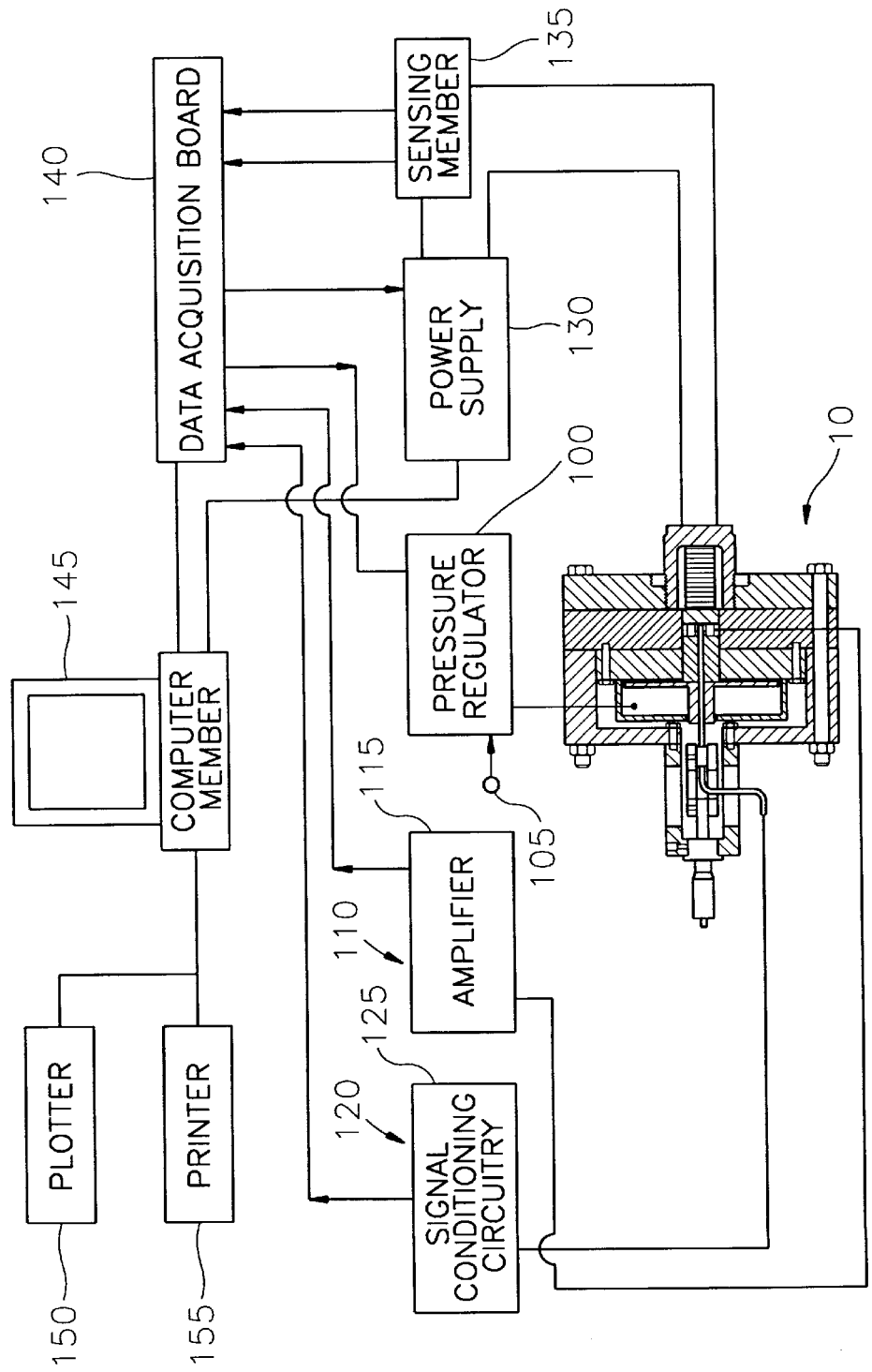
FIG. 3 shows a block diagram of the control circuitry associated with the testing apparatus.
Figure 4:
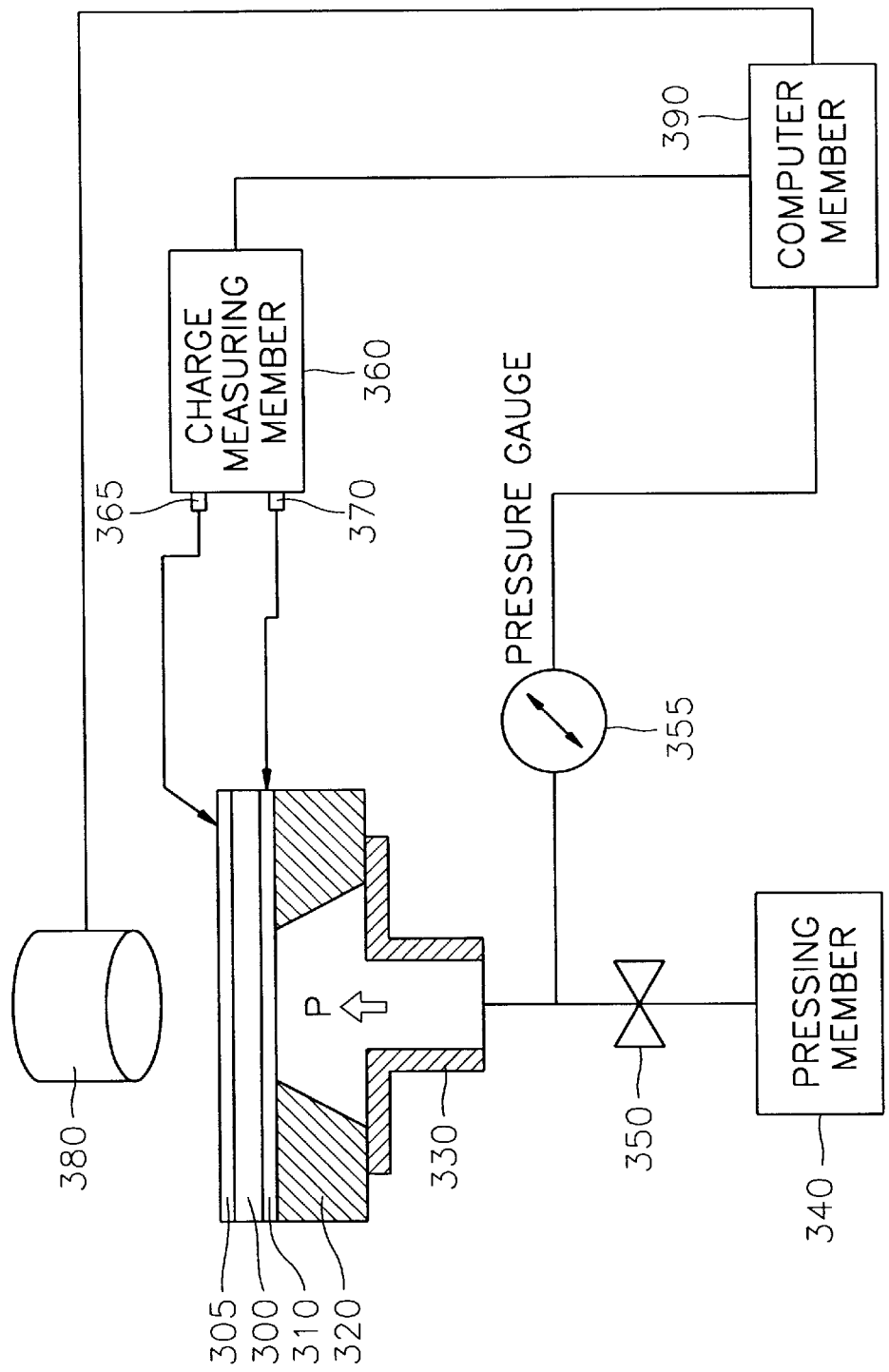
FIG. 4 illustrates an apparatus for measuring a piezoelectric constant of a thin film shaped piezoelectric material according to a first embodiment of the present invention.

FIG. 4 illustrates an apparatus for measuring a piezoelectric constant of a thin film shaped piezoelectric material according to a first embodiment of the present invention.

Referring to FIG. 4, the apparatus for measuring a piezoelectric constant of a thin film shaped piezoelectric material has a thin film shaped piezoelectric material 300 including a top electrode 305 and a bottom electrode 310, a substrate 320, a conduit tube 330, a pressing member 340, a release valve 350, a microscope 380, a pressure gauge 355, a charge measuring member 360 having a first terminal 365 and a second terminal 370, and a computer member 390.

The top electrode 305 is formed on the thin film shaped piezoelectric material 300 and the bottom electrode 310 is formed beneath the thin film shaped piezoelectric material 300. The thin film shaped piezoelectric material 300 having the top electrode 305 and the bottom electrode 310 is attached to the substrate 320. A portion of the bottom electrode 310 is exposed through an opening of the substrate 320. The conduit pipe 330 is attached to the bottom of the substrate 320 around the opening of the substrate 320.

Pressing member 340 applies a predetermined pneumatic pressure to thin film shaped piezoelectric material 320 through the conduit pipe 330 and the opening of the substrate 320. The release valve 350 has a first pipe connected to the conduit pipe 330 and to the pressure gauge 350, and a second pipe connected to the pressing member 340. When the applied pneumatic pressure reduces or increases, the piezoelectric constant of thin film shaped piezoelectric material 300 can be measured by using release valve 355.

The microscope 380 is placed above the top electrode 305 at a predetermined distance away from the top electrode 305. The microscope 380 measures the height of deformation of the thin film shaped piezoelectric material 300 by means of variation of the focusing distance when the thin film shaped piezoelectric material 300 is deformed by the applied pneumatic pressure. The pressure gauge 355 is connected to the first pipe of the release valve 350 and is connected to the computer member 390. The pressure gauge 355 displays the applied pneumatic pressure and measures the applied pneumatic pressure.

The first terminal 365 of the charge measuring member 360 is connected to bottom electrode 310 and the second terminal 370 of the charge measuring member 360 is connected to top electrode 305. The charge measuring member 360 measures a magnitude of a charge generated from the thin film shaped piezoelectric material 300 through the top electrode 305 and the bottom electrode 310. The computer member 390 has a first terminal connected to the pressure gauge 355, a second terminal connected to charge measuring member 360 and a third terminal connected to the microscope 380. The computer member 390 controls the above-described elements and calculates the piezoelectric constant of the thin film shaped piezoelectric material 300.

Manufacturing steps for a test piece of a thin film shaped piezoelectric material according to the present embodiment will be described.

Figure 6A:
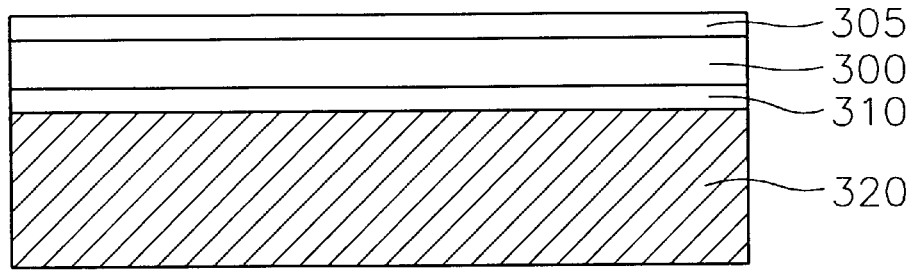
FIGS. 6A to 6B illustrate the manufacturing steps of a test piece of the thin film shaped piezoelectric material according to the first embodiment of the present invention.
Figure 6B:
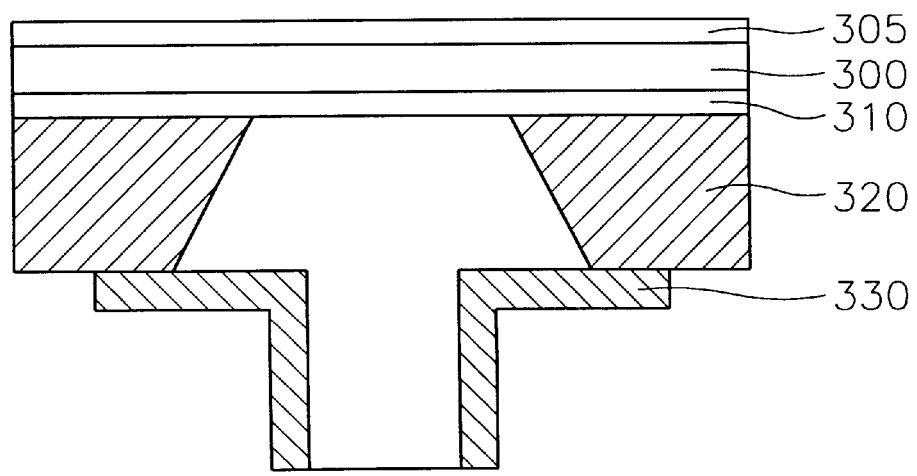

FIGS. 6A to 6B illustrate the manufacturing steps of a test piece of a thin film shaped piezoelectric material according to the present embodiment. In FIGS. 6A to 6B, the same numerals are used for the same elements as in FIG. 4.

Referring to FIG. 6A, the bottom electrode 310 is formed on the substrate 320 made of a silicon. The bottom electrode 310 is formed by using an electrically conductive metal such as gold (Au), platinum (Pt), tantalum (Ta), or platinum-tantalum (Pt-Ta) and by a sputtering method or a chemical vapor deposition (CVD) method. The thin film shaped piezoelectric material 300 is formed on the bottom electrode 310 by a sputtering method or a CVD method. The thin film shaped piezoelectric material 300 is formed by using lead zirconate titanate (PZT) which is produced by a sol-gel method.

The top electrode 305 is formed on the thin film shaped piezoelectric material 300 by using an electrically conductive metal such as gold, platinum, tantalum, or platinum-tantalum and by a sputtering method or a CVD method.

Referring to FIG. 6B, the opening is formed in the bottom of the substrate 320 by etching in order to apply the pneumatic pressure to the thin film shaped piezoelectric material 300, so a portion of the bottom electrode 310 is exposed. Subsequently, the conduit pipe 330 is attached to the bottom of the substrate 320 around the opening of the substrate 320, so the test piece of the thin film shaped piezoelectric material 300 is completed.

A method for measuring the piezoelectric constant of the thin film shaped piezoelectric material by using the apparatus according to the first embodiment of the present invention will be described.

In the conventional method, a magnitude of displacement of a piezoelectric material is measured in order to calculate a piezoelectric constant of the piezoelectric material after a predetermined voltage is applied to the piezoelectric material. However, in the first embodiment of the present invention, a pneumatic loading method is used as a method for measuring a piezoelectric constant of a thin film shaped piezoelectric material. In the pneumatic method, the piezoelectric constant is calculated by measuring a magnitude of the charge generated from the piezoelectric material and a stress generated in the piezoelectric material after a predetermined pneumatic pressure is applied to the piezoelectric material.

Figure 5:
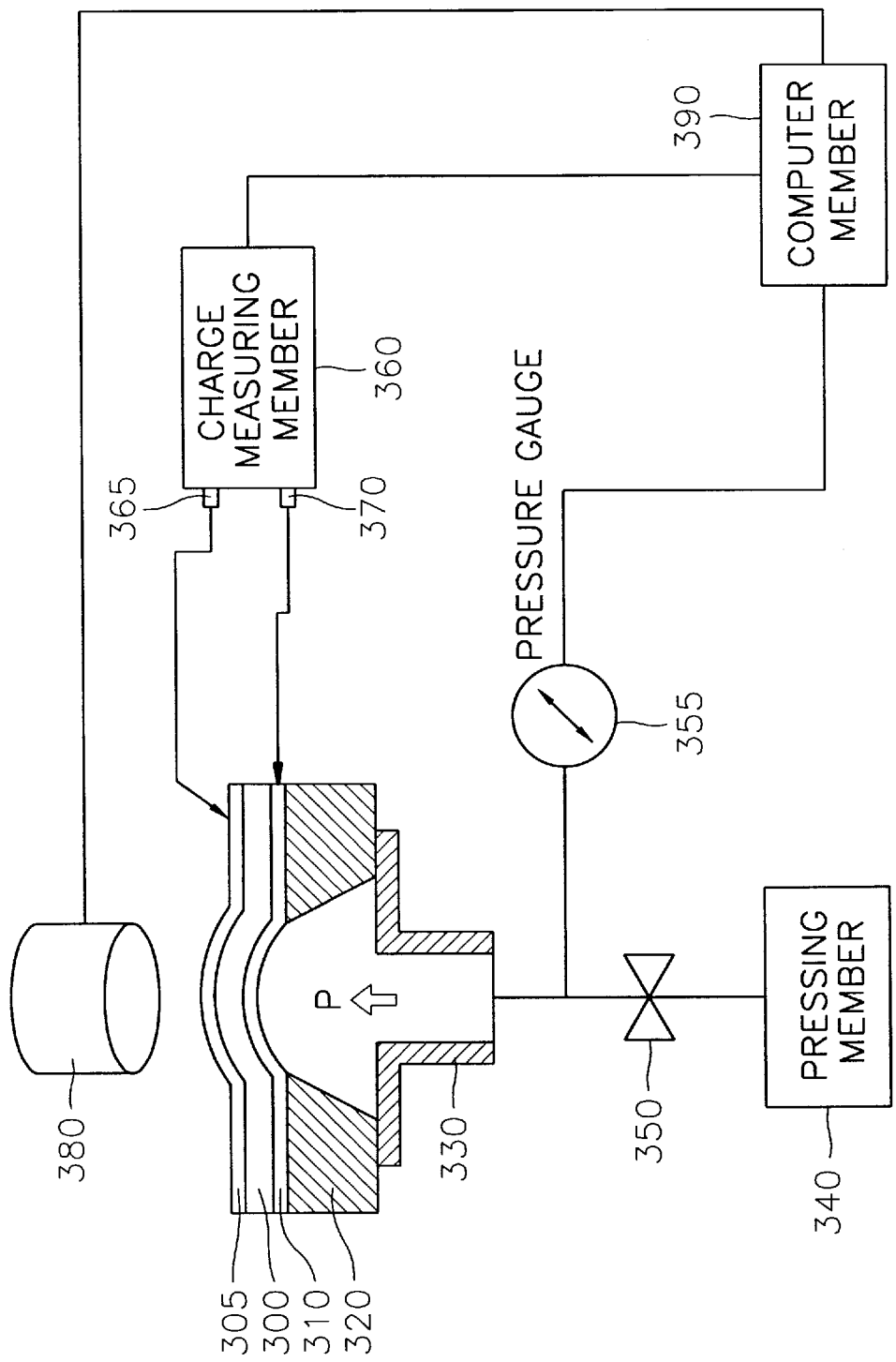
FIG. 5 illustrates a state in which a pneumatic pressure is applied to the thin film shaped piezoelectric material in order to measure the piezoelectric constant according to a first embodiment of the present invention.

FIG. 5 illustrates a state in which a pneumatic pressure is applied to the thin film shaped piezoelectric material in order to measure the piezoelectric constant according to the present embodiment.

Referring to FIG. 5, in order to measure the piezoelectric constant of the thin film shaped piezoelectric material 300, the computer member 390, the pressure gauge 355, the charge measuring member 360, and the pressing member 340 are initialized before a pneumatic pressure (P) is applied to the thin film shaped piezoelectric material 300. The thin film shaped piezoelectric material 300 having the top electrode 305 and the bottom electrode 310 is formed on the substrate 320. Next, the microscope 380 is placed above the top electrode 305 formed on the thin film shaped piezoelectric material 300 so as to measure the height of the displacement of the thin film shaped piezoelectric material 300 by means of the variation of the focusing distance of the microscope 380.

The first terminal 365 of the charge measuring member 360 is connected to the top electrode 305 and the second terminal 370 of the charge measuring member 360 is connected to the bottom electrode 310, so as to measure the magnitude of a charge generated from the thin film shaped piezoelectric material 300. Hence, the charge measuring member 360 measures the minute charge generated from the thin film shaped piezoelectric material 300 through the top electrode 305 and the bottom electrode 310. Preferably, a charge amplifier or a picoammeter may be used as the charge measuring member 360.

Subsequently, the pressing member 340 is operated in order to generate the pneumatic pressure (P) and to apply the pneumatic pressure (P) to the thin film shaped piezoelectric material 300. Preferably, the pressing member 340 is a vacuum pump or a compressor. Then, the release valve 350 is operated in order to change the pneumatic pressure (P) applied to the thin film shaped piezoelectric material 300. When the pneumatic pressure (P) is applied to the thin film shaped piezoelectric material 300, the thin film shaped piezoelectric material 300 is deformed in the upward direction. In the case that the applied pneumatic pressure (P) is changed, the magnitude of the charge generated from the thin film shaped piezoelectric material 300 is measured by using the charge measuring member 360, and then the magnitude of charge is recorded in the computer member 390. At the same time, computer member 390 records the magnitude of the applied pneumatic pressure (P) from the pressure gauge 355. When the pneumatic pressure (P) is applied to the thin film shaped piezoelectric material 300, the stress is generated in the thin film shaped piezoelectric material 300. In this case, after the microscope 380 measures the height of the displacement of the thin film shaped piezoelectric material 300 and records the measured height in the computer member 390, the computer member 390 calculates the stress (a) generated in the thin film shaped piezoelectric material 300 according to the relationship:

$$\sigma = f\left(P, a^2, \frac{1}{h}, \frac{1}{t}\right) = \frac{Pa^2}{4ht}$$

wherein σ represents the stress generated in the thin film shaped piezoelectric material, P represents the pneumatic pressure, a represents the diameter of the thin film shaped piezoelectric material, h represents the height of the displacement of the thin film shaped piezoelectric material, and t represents a thickness of the thin film shaped piezoelectric material.

That is, when the predetermined pneumatic pressure (P) is applied to the thin film shaped piezoelectric material 300 from the pressing member 340 through release valve 360, the conduit pipe 330, and the opening of the substrate 320, the charge generated from the tin film shaped piezoelectric material 300 is measured by the charge measuring member 360 through the top electrode 305, the bottom electrode 310, and the first and the second terminals 365, 370 of the charge measuring member 360. The magnitude of the measured charge is recorded in the computer member 390. The magnitude of the applied pneumatic pressure (P) is numerically indicated by the pressure gauge 350, so the magnitude of the applied pneumatic pressure (P) is adjusted by using the pressure gauge 350. Also, the diameter and the thickness of the thin film shaped piezoelectric material 300 is recorded in the computer member 390.

When the release valve 350 changes the magnitude of the applied pneumatic pressure (P), the magnitude of the charge generated from the thin film shaped piezoelectric material 300 is variable. The charge measuring member 360 measures this magnitude of the charge and transfers the measured magnitude of the charge to the computer member 390. When the vacuum pump is used as the pressing member 340, a vacuum pressure can be applied to the thin film shaped piezoelectric material 300. Also, when a compressor is used as the pressing member 340, a high pressure can be applied to the thin film shaped piezoelectric material 300. Therefore, the range of applied pneumatic pressure (P) is increased, so an exact measurement is possible.

In the conventional apparatus, it is difficult to apply uniform force to a piezoelectric material having a thin thickness and a tough surface condition because the force is mechanically applied to the piezoelectric material by using the load cell. When the force is applied, a short may occur in the thin piezoelectric material or a plastic deformation of the thin film piezoelectric material may occur. Hence, it is difficult to exactly measure the piezoelectric constant of the piezoelectric material as an error may occur when the piezoelectric constant is measured. Furthermore, when the piezoelectric constant is calculated by using the optic sensor means in order to measure the displacement of the multilayer piezoelectric actuator, the value of the piezoelectric constant may vary according to the array and the condition of the optic sensor and the multilayer piezoelectric actuator. Also, when the applied voltage is low, an error in the measured piezoelectric constant may occur because the displacement of the multilayer piezoelectric actuator is very small.

In the first embodiment of the present invention, however, a uniform pneumatic pressure (P) can be applied to the thin film shaped piezoelectric material 300 without considering a topology of the piezoelectric material because the pneumatic pressure resulting from a uniform vacuum pressure or a uniform gas pressure can be applied to the thin film shaped piezoelectric material 300. Also, a short in the thin film shaped piezoelectric material 300 or a plastic deformation of the thin film shaped piezoelectric 300 can be prevented. The charge measuring member 360 can prevent an error in the measurement of the charge generated from the piezoelectric material.

The computer member 390 calculates the piezoelectric constant based on the measured magnitudes of the charge and the stress of the thin film shaped piezoelectric material 300 according to the relationship:

$$\text{piezoelectric constant} = \left(\frac{\partial D}{\partial P}\right) = \frac{Q}{\sigma}$$

wherein D represents a charge density, P represents the applied pneumatic pressure, Q represents the magnitude of the charge generated from the thin film shaped piezoelectric material, and a represents the stress generated in the thin film shaped piezoelectric material.

Embodiment 2

FIG. 7 illustrates an apparatus for measuring a piezoelectric constant of a thin film shaped piezoelectric material according to a second embodiment of the present invention. The elements in FIG. 7 have the same reference numerals as in FIG. 4.

Referring to FIG. 7, the apparatus for measuring a piezoelectric constant of a thin film shaped piezoelectric material has a thin film shaped piezoelectric material 300 including a top electrode 305 and a bottom electrode 310, a substrate 320, a conduit tube 330, a pressing member 340, a release valve 350, a strain gauge 400, a pressure gauge 355, a charge measuring member 360 having a first terminal 365 and a second terminal 370, and a computer member 390.

The top electrode 305 is formed on the thin film shaped piezoelectric material 300 and the bottom electrode 310 is formed beneath the thin film shaped piezoelectric material 300. The thin film shaped piezoelectric material 300 having the top electrode 305 and the bottom electrode 310 is attached to the substrate 320. A portion of the bottom electrode 310 is exposed through an opening of the substrate 320. The conduit pipe 330 is attached to the bottom of the substrate 320 around the opening of the substrate 320.

Pressing member 340 applies a predetermined pneumatic pressure to thin film shaped piezoelectric material 320 through the conduit pipe 330 and the opening of the substrate 320. The release valve 350 has a first pipe connected to the conduit pipe 330 and to the pressure gauge 350, and a second pipe connected to the pressing member 340. When the applied pneumatic pressure reduces or increases, the piezoelectric constant of thin film shaped piezoelectric material 300 can be measured by using release valve 355.

The strain gauge 400 is attached to the top electrode 305. The strain gauge 400 directly measures the stress generated in the thin film shaped piezoelectric material 300. The stress of the thin film shaped piezoelectric material 300 is caused by the pneumatic pressure (P). The pressure gauge 355 is connected to the first pipe of the release valve 350 and is connected to the computer member 390. The pressure gauge 355 displays the applied pneumatic pressure and measures the applied pneumatic pressure.

The first terminal 365 of the charge measuring member 360 is connected to bottom electrode 310 and the second terminal 370 of the charge measuring member 360 is connected to top electrode 305. The charge measuring member 360 measures a magnitude of charge generated from the thin film shaped piezoelectric material 300 through the top electrode 305 and the bottom electrode 310. The computer member 390 has a first terminal connected to the pressure gauge 355, a second terminal connected to charge measuring member 360 and a third terminal connected to the strain gauge 400. The computer member 390 controls the above-described elements and calculates the piezoelectric constant of the thin film shaped piezoelectric material 300.

Manufacturing steps for a test piece of a thin film shaped piezoelectric material according to the present embodiment are the same as the manufacturing steps of the first embodiment except for the case of the strain gauge 400.

A method for measuring the piezoelectric constant of the thin film type piezoelectric material by using the apparatus according to the second embodiment of the present invention will be described.

Figure 8:
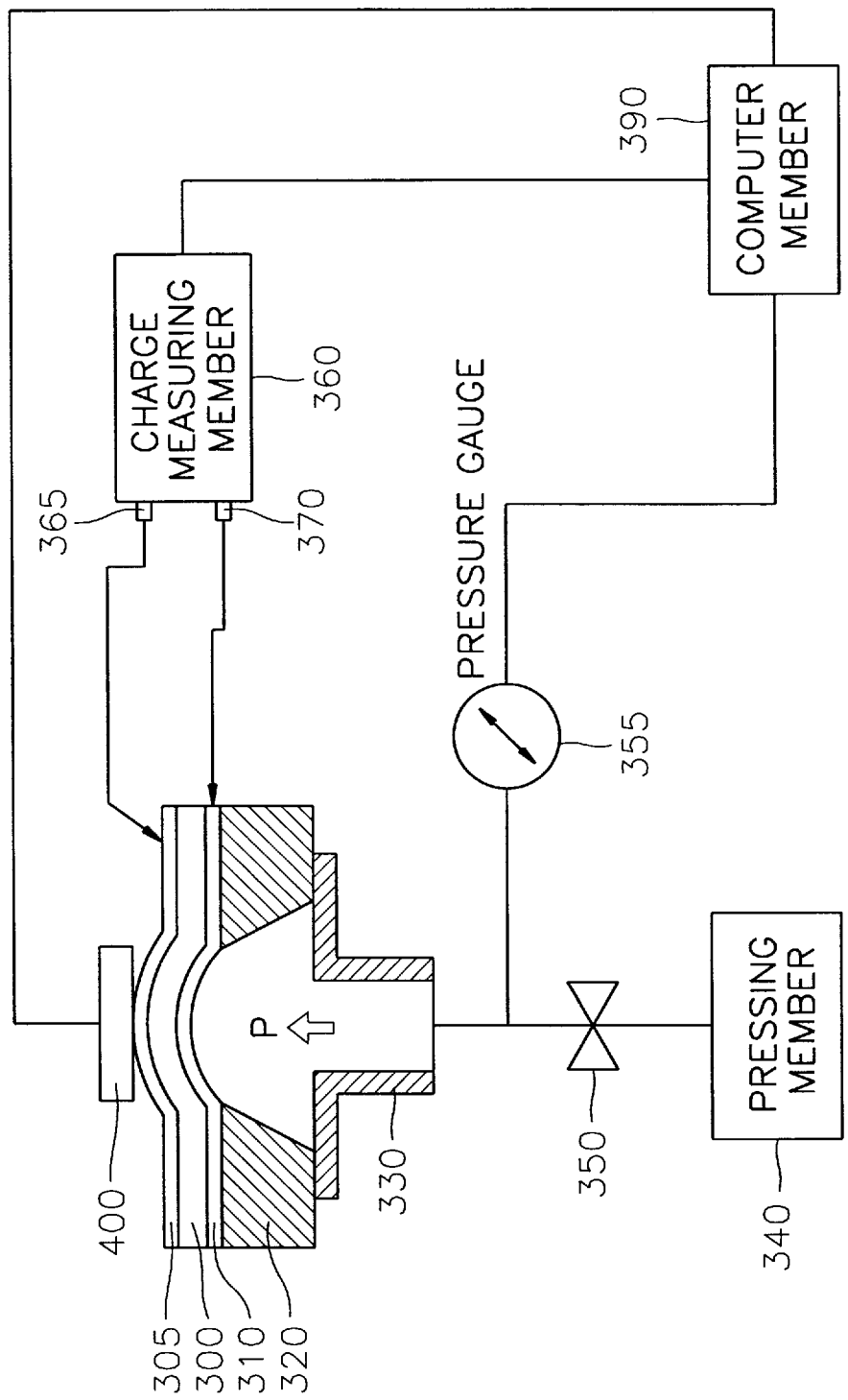
FIG. 8 illustrates a state in which a pneumatic pressure is applied to the thin film shaped piezoelectric material in order to measure the piezoelectric constant according to a second embodiment of the present invention.

FIG. 8 illustrates a state in which a pneumatic pressure is applied to the thin film shaped piezoelectric material in order to measure the piezoelectric constant according to a second embodiment of the present invention.

In the second embodiment of the present invention, the pneumatic loading method is also used as a method for measuring a piezoelectric constant of a thin film type piezoelectric material.

Referring to FIG. 8, in order to measure the piezoelectric constant of the thin film shaped piezoelectric material 300, the computer member 390, the pressure gauge 355, the charge measuring member 360, and the pressing member 340 are initialized before a pneumatic pressure (P) is applied to the thin film shaped piezoelectric material 300. The thin film shaped piezoelectric material 300 having the top electrode 305 and the bottom electrode 310 is formed on the substrate 320. Next, the strain gauge 400 is attached to the top electrode 305 formed on the thin film shaped piezoelectric material 300 so as to directly measure the stress generated in the thin film shaped piezoelectric material 300.

The first terminal 365 of the charge measuring member 360 is connected to the top electrode 305 and the second terminal 370 of the charge measuring member 360 is connected to the bottom electrode 310, so as to measure the magnitude of a charge generated from the thin film shaped piezoelectric material 300. Hence, the charge measuring member 360 measures the minute charge generated from the thin film shaped piezoelectric material 300 through the top electrode 305 and the bottom electrode 310. Preferably, a charge amplifier or a picoammeter may be used as the charge measuring member 360.

Subsequently, the pressing member 340 is operated in order to generate the pneumatic pressure (P) and to apply the pneumatic pressure (P) to the thin film shaped piezoelectric material 300. Preferably, the pressing member 340 is a vacuum pump or a compressor. Then, the release valve 350 is operated in order to change the pneumatic pressure (P) applied to the thin film shaped piezoelectric material 300. When the pneumatic pressure (P) is applied to the thin film shaped piezoelectric material 300, the thin film shaped piezoelectric material 300 is deformed in the upward direction. In the case that the applied pneumatic pressure (P) is changed, the magnitude of the charge generated from the thin film shaped piezoelectric material 300 is measured by using the charge measuring member 360, and then the magnitude of charge is recorded in the computer member 390. When the pneumatic pressure (P) is applied to the thin film shaped piezoelectric material 300, the stress is generated in the thin film shaped piezoelectric material 300. In this case, after the strain gauge 400 measures the stress of the thin film shaped piezoelectric material 300 and records the measured stress in the computer member 390, the computer member 390 calculates the piezoelectric constant based on the measured the magnitude of the charge generated from the thin film shaped piezoelectric material and the stress generated in the thin film shaped piezoelectric material according to the relationship:

$$\text{piezoelectric constant} = \left(\frac{\partial D}{\partial P}\right) = \frac{Q}{\sigma}$$

wherein D represents a charge density, P represents the applied pneumatic pressure, Q represents the magnitude of the charge generated from the thin film shaped piezoelectric material, and a represents the stress generated in the thin film shaped piezoelectric material.

When the predetermined pneumatic pressure (P) is applied to the thin film shaped piezoelectric material 300 from the pressing member 340 through release valve 360, the conduit pipe 330, and the opening of the substrate 320, the charge generated from the thin film shaped piezoelectric material 300 is measured by the charge measuring member 360 through the top electrode 305, the bottom electrode 310, and the first and the second terminals 365, 370 of the charge measuring member 360. The magnitude of the measured charge is recorded in the computer member 390. Also, the strain gauge 400 attached to the top electrode 305 directly measures the stress generated in the thin film shaped piezoelectric material 300 and records the measured stress in the computer member 390. The magnitude of the applied pneumatic pressure (P) is numerically indicated by the pressure gauge 350, so the magnitude of the applied pneumatic pressure (P) is adjusted by using the pressure gauge 350.

When the release valve 350 changes the magnitude of the applied pneumatic pressure (P), the magnitude of the charge generated from the thin film shaped piezoelectric material 300 is variable. The charge measuring member 360 measures this magnitude of the charge and transfers the measured magnitude of the charge to the computer member 390. If the vacuum pump is used as the pressing member 340, a vacuum pressure can be applied to the thin film shaped piezoelectric material 300. Also, if a compressor is used as the pressing member 340, a high pressure can be applied to the thin film shaped piezoelectric material 300. Therefore, the range of applied pneumatic pressure (P) is increased, so an exact measurement is possible.

Figure 9:
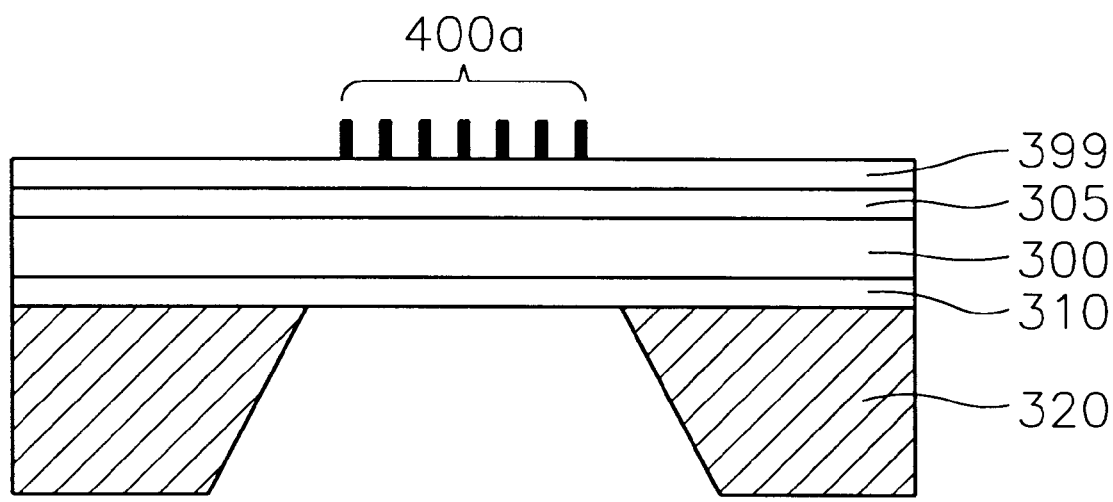
FIG. 9 illustrates a test piece of the thin film shaped piezoelectric material according to another embodiment of the present invention.

In the present embodiment, the strain gauge 400 is attached to the top electrode 305. However, a strain gauge 400a can be integrally formed with the thin film shaped piezoelectric material 300 having the top electrode 305 as shown in FIG. 9. An insulating layer 399 is interposed between the strain gauge 400a and the top electrode 305.

In the second embodiment of the present invention, however, the uniform pneumatic pressure (P) can be applied to the thin film shaped piezoelectric material 300 without considering a topology of the piezoelectric material because the pneumatic pressure resulting from a uniform vacuum pressure or a uniform gas pressure, can be applied to the thin film shaped piezoelectric material 300. Also, a short in the thin film shaped piezoelectric material 300 or a plastic deformation of the thin film shaped piezoelectric 300 can be prevented.

Although preferred embodiments of the present invention have been described, it is understood that the present invention should not be limited to these preferred embodiments, but various changes and modifications can be made by one skilled in the art within the spirit and scope of the invention as hereinafter claimed.

What is claimed is:

1. A method for measuring a piezoelectric constant of a piezoelectric material comprising the steps of:
    forming a thin film shaped piezoelectric material on a bottom electrode after the bottom electrode is formed;
    forming a top electrode on the thin film shaped piezoelectric material;
    placing a microscope for measuring a height of a displacement of the thin film shaped piezoelectric material above the top electrode;
    generating a pneumatic pressure from a pressing means;
    applying the pneumatic pressure to the thin film shaped piezoelectric material placed between the top electrode and the bottom electrode through a conduit pipe;
    changing the pneumatic pressure applied to the thin film shaped piezoelectric material;
    measuring a charge generated from the thin film shaped piezoelectric material after the top electrode is connected to a first terminal of a charge measuring means and the bottom electrode is connected to a second terminal of the charge measuring means;
    recording the measured charge and the magnitude of the applied pneumatic pressure in a computer means; and
    calculating the piezoelectric constant of the thin film shaped piezoelectric material by using the measured charge and the magnitude of the applied pneumatic pressure.

2. The method for measuring a piezoelectric constant of a thin film shaped piezoelectric material as claimed in claim 1, wherein the bottom electrode is formed on a substrate after the substrate is provided.

3. The method for measuring a piezoelectric constant of a thin film shaped piezoelectric material as claimed in claim 2, the step of forming the top electrode further comprising forming an opening in the bottom of the substrate by etching a portion of the bottom of the substrate to expose a portion of the bottom electrode.

4. The method for measuring a piezoelectric constant of a thin film shaped piezoelectric material as claimed in claim 1, wherein the top electrode and the bottom electrode are respectively formed by using an electrically conductive metal such as gold, platinum, tantalum, or platinum-tantalum and by using a sputtering method.

5. The method for measuring a piezoelectric constant of a thin film shaped piezoelectric material as claimed in claim 1, wherein the step of forming the thin film shaped piezoelectric material is performed by using lead zirconate titanate (Pb(Zr,Ti)O$_3$) produced by a sol-gel method and is performed by a sputtering method.

6. The method for measuring a piezoelectric constant of a thin film shaped piezoelectric material as claimed in claim 1, wherein the pressing means is a vacuum pump or a compressor.

7. The method for measuring a piezoelectric constant of a thin film shaped piezoelectric material as claimed in claim 1, wherein the step of applying the pneumatic pressure to the thin film shaped piezoelectric material is performed after initializing the computing means, a pressure gauge, the charge measuring means, and the pressing means.

8. The method for measuring a piezoelectric constant of a thin film shaped piezoelectric material as claimed in claim 1, wherein the step of changing the pneumatic pressure applied to the thin film shaped piezoelectric material is performed by adjusting the pneumatic pressure by operating a release valve.

9. The method for measuring a piezoelectric constant of a thin film shaped piezoelectric material as claimed in claim 1, wherein the charge measuring means is a charge amplifier or a picoammeter.

10. The method for measuring a piezoelectric constant of a thin film shaped piezoelectric material as claimed in claim 1, the step of calculating the piezoelectric constant of the thin film shaped piezoelectric material further comprising the steps of:
    recording the measured height of the displacement of the thin film shaped piezoelectric material in the computer means;
    recording a diameter and a thickness of the thin film shaped piezoelectric material in the computer means;
    calculating a stress generated in the thin film shaped piezoelectric material by using the magnitude of the applied pneumatic pressure and the diameter and the thickness of the thin film shaped piezoelectric material; and
    calculating the piezoelectric constant of the thin film shaped piezoelectric material by using the calculated stress and the recorded charge.

11. The method for measuring a piezoelectric constant of a thin film shaped piezoelectric material as claimed in claim 10, wherein the step of calculating a stress generated in the thin film shaped piezoelectric material is performed according to the relationship:

$$\sigma = f\left(P, a^2, \frac{1}{h}, \frac{1}{t}\right) = \frac{Pa^2}{4ht}$$

wherein σ represents the stress generated in the thin film shaped piezoelectric material, P represents the pneumatic pressure, a represents the diameter of the thin film shaped piezoelectric material, h represents the height of the displacement of the thin film shaped piezoelectric material, and t represents a thickness of the thin film shaped piezoelectric material.

12. The method for measuring a piezoelectric constant of a thin film shaped piezoelectric material as claimed in claim 11, wherein the step of calculating the piezoelectric constant of the thin film shaped piezoelectric material is performed according to the relationship:

$$\text{piezoelectric constant} = \left(\frac{\partial D}{\partial P}\right) = \frac{Q}{\sigma}$$

wherein D represents a charge density, P represents the applied pneumatic pressure, Q represents the magnitude of the charge generated from the thin film shaped piezoelectric material, and σ represents the stress generated in the thin film shaped piezoelectric material.

13. A method for measuring a piezoelectric constant of a piezoelectric material comprising the steps of:

forming a bottom electrode on a substrate after the substrate is provided;

forming a thin film shaped piezoelectric material on the bottom electrode;

forming a top electrode on the thin film shaped piezoelectric material;

placing a microscope for measuring a height of a displacement of the thin film shaped piezoelectric material above the top electrode;

generating a pneumatic pressure from a pressing means;

applying the pneumatic pressure through a conduit pipe to the thin film shaped piezoelectric material placed between the top electrode and the bottom electrode;

changing the pneumatic pressure applied to the thin film shaped piezoelectric material by adjusting a release valve;

measuring a charge generated from the thin film shaped piezoelectric material after the top electrode is connected to a first terminal of a charge measuring means and the bottom electrode is connected to a second terminal of the charge measuring means;

recording the measured charge and the magnitude of the applied pneumatic pressure in a computer means;

recording the measured height of the displacement of the thin film shaped piezoelectric material in the computer means; and calculating the piezoelectric constant of the thin film shaped piezoelectric material by using the measured charge and the magnitude of the applied pneumatic pressure.

14. The method for measuring a piezoelectric constant of a thin film shaped piezoelectric material as claimed in claim 13, wherein the steps of forming the bottom electrode and the top electrode are respectively performed by using an electrically conductive metal such as gold, platinum, tantalum, or platinum-tantalum and by using a sputtering method.

15. The method for measuring a piezoelectric constant of a thin film shaped piezoelectric material as claimed in claim 13, wherein the step of forming the thin film shaped piezoelectric material is performed by using lead zirconate titanate (Pb(Zr,Ti)O$_3$) produced by a sol-gel method and by a sputtering method.

16. The method for measuring a piezoelectric constant of a thin film shaped piezoelectric material as claimed in claim 13, the step of calculating the piezoelectric constant of the thin film shaped piezoelectric material further comprising the steps of:

recording a diameter and a thickness of the thin film shaped piezoelectric material in the computer means;

calculating a stress generated in the thin film shaped piezoelectric material by using the magnitude of the applied pneumatic pressure and the diameter and the thickness of the thin film shaped piezoelectric material; and calculating the piezoelectric constant of the thin film shaped piezoelectric material by using the calculated stress and the recorded charge.

17. The method for measuring a piezoelectric constant of a thin film shaped piezoelectric material as claimed in claim 16, wherein the step of calculating a stress generated in the thin film shaped piezoelectric material is performed according to the relationship:

$$\sigma = f\left(P, a^2, \frac{1}{h}, \frac{1}{t}\right) = \frac{Pa^2}{4ht}$$

wherein $\sigma$ represents the stress generated in the thin film shaped piezoelectric material, P represents the pneumatic pressure, a represents the diameter of the thin film shaped piezoelectric material, h represents the height of the displacement of the thin film shaped piezoelectric material, and t represents a thickness of the thin film shaped piezoelectric material.

18. The method for measuring a piezoelectric constant of a thin film shaped piezoelectric material as claimed in claim 17, wherein the step of calculating the piezoelectric constant of the thin film shaped piezoelectric material is performed according to the relationship:

$$\text{piezoelectric constant} = \left(\frac{\partial D}{\partial P}\right) = \frac{Q}{\sigma}$$

wherein D represents a charge density, P represents the applied pneumatic pressure, Q represents the magnitude of the charge generated from the thin film piezoelectric material, and $\sigma$ represents the stress generated in the thin film shaped piezoelectric material.

19. A method for measuring a piezoelectric constant of a piezoelectric material comprising the steps of:

forming a bottom electrode on a substrate after the substrate is provided;

forming a thin film shaped piezoelectric material on the bottom electrode;

forming a top electrode on the thin film shaped piezoelectric material;

forming a strain gauge for measuring a stress generated in the thin film shaped piezoelectric material on the top electrode;

generating a pneumatic pressure from a pressing means;

applying the pneumatic pressure to the thin film shaped piezoelectric material placed between the top electrode and the bottom electrode through a conduit pipe;

changing the pneumatic pressure applied to the thin film shaped piezoelectric material by adjusting a release valve;

measuring a charge generated from the thin film shaped piezoelectric material after the top electrode is connected to a first terminal of a charge measuring means and the bottom electrode is connected to a second terminal of the charge measuring means;

recording the measured charge and the measured stress in a computer means;

recording the measured height of the displacement of the thin film shaped piezoelectric material in the computer means; and calculating the piezoelectric constant of the thin film shaped piezoelectric material by using the measured charge and the magnitude of the applied pneumatic pressure.

* * * * *